United States Patent

Kinoshita et al.

(10) Patent No.: US 10,529,608 B2
(45) Date of Patent: Jan. 7, 2020

(54) SUBSTRATE PROCESSING APPARATUS AND SUBSTRATE PROCESSING METHOD

(71) Applicant: Tokyo Electron Limited, Tokyo (JP)

(72) Inventors: Moriyoshi Kinoshita, Iwate (JP); Hiroshi Kumada, Tokyo (JP); Hiroyuki Matsuyoshi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 88 days.

(21) Appl. No.: 15/440,100

(22) Filed: Feb. 23, 2017

(65) Prior Publication Data

US 2017/0256430 A1    Sep. 7, 2017

(30) Foreign Application Priority Data

Mar. 2, 2016  (JP) ................................ 2016-039543

(51) Int. Cl.
*H01L 21/677* (2006.01)
*H01L 21/673* (2006.01)
*H01L 21/67* (2006.01)

(52) U.S. Cl.
CPC .. *H01L 21/67757* (2013.01); *H01L 21/67126* (2013.01); *H01L 21/67303* (2013.01); *H01L 21/67745* (2013.01)

(58) Field of Classification Search
CPC ......... H01L 21/67126; H01L 21/67303; H01L 21/67745; H01L 21/67757
See application file for complete search history.

(56) References Cited

U.S. PATENT DOCUMENTS

| | | | | |
|---|---|---|---|---|
| 8,172,947 | B2* | 5/2012 | Shibata | H01L 21/67126 118/715 |
| 8,876,453 | B2* | 11/2014 | Aburatani | H01L 21/67109 414/161 |
| 2011/0179717 | A1* | 7/2011 | Taniyama | H01L 21/67126 49/324 |
| 2017/0198397 | A1* | 7/2017 | Komae | H01L 21/67126 |

FOREIGN PATENT DOCUMENTS

| | | | |
|---|---|---|---|
| JP | 2005-056905 A | 3/2005 | |
| JP | 2013-012538 A | 1/2013 | |
| WO | WO-2016052023 A1 * | 4/2016 | ........... H01L 21/677 |

* cited by examiner

*Primary Examiner* — James Keenan
(74) *Attorney, Agent, or Firm* — Abelman, Frayne & Schwab

(57) ABSTRACT

Disclosed is a substrate processing apparatus including: a substrate holding unit configured to hold a substrate; a processing container configured to accommodate the substrate holding unit; a cover unit configured to load the substrate holding unit therein and to open or close an opening provided in one end of the processing container; a seal member configured to seal a gap between the end of the processing container and the cover unit; a driving mechanism configured to move the cover unit; and a controller configured to control an operation of the driving mechanism. The controller controls the operation of the driving mechanism such that the cover unit performs an intermittent operation of alternately repeating moving and stopping when opening the opening in the processing container.

14 Claims, 4 Drawing Sheets

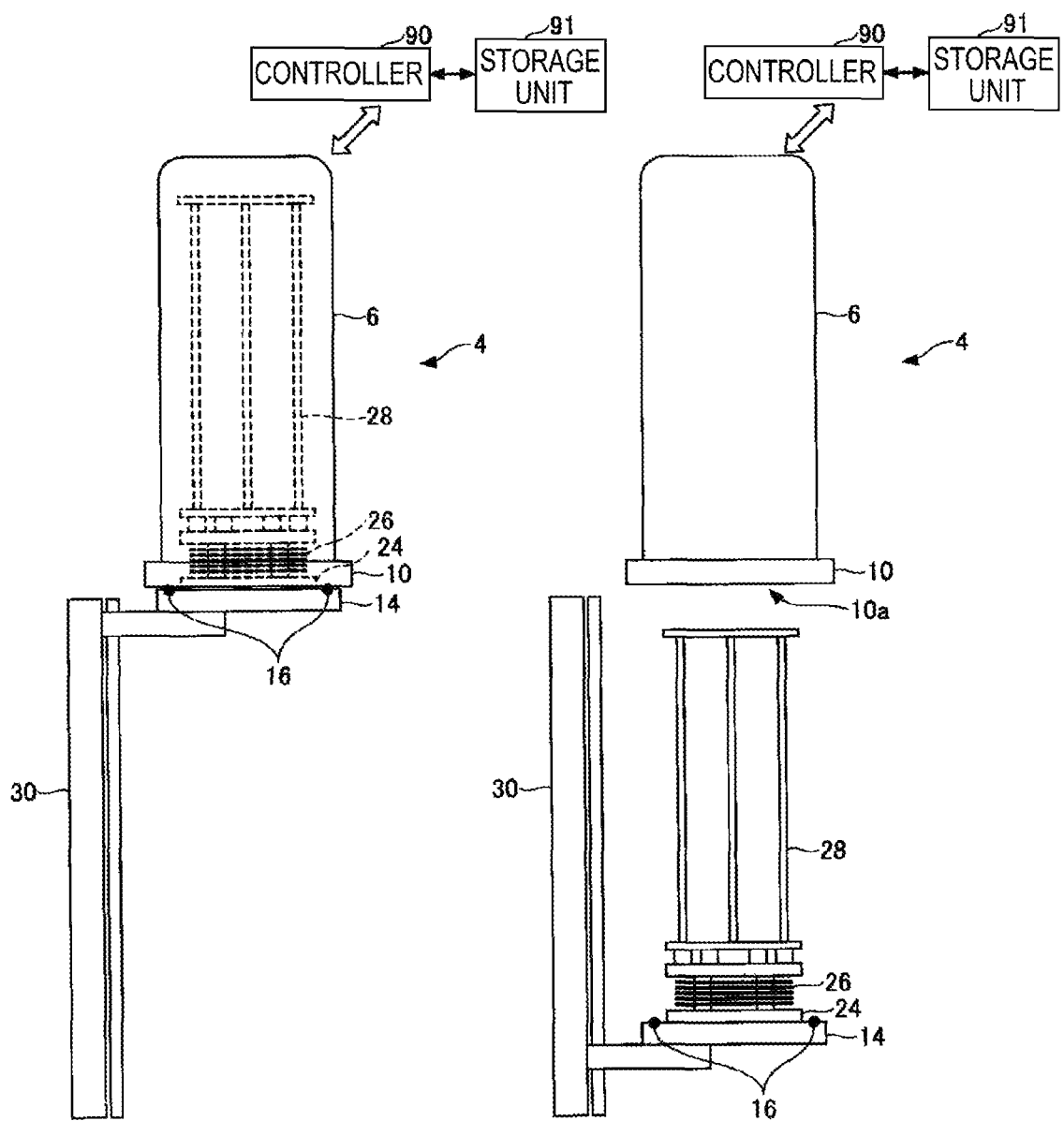

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2016-039543 filed on Mar. 2, 2016 with the Japan Patent Office, the disclosure of which is incorporated herein in its entirety by reference.

TECHNICAL FIELD

Various aspects and embodiments of the present disclosure relate to a substrate processing apparatus and a substrate processing method.

BACKGROUND

In the related art, there is known a substrate processing apparatus which includes a processing container that processes a substrate, a boat that holds the substrate, a cover unit that opens or closes a furnace opening provided in the lower end of the processing container, and a lifting mechanism that raises the boat and the cover unit together to carry the boat into the processing container and to press the cover unit onto the furnace opening. In such a substrate processing apparatus, a seal member such as, for example, an O-ring is attached to the cover unit such that the lower end of the processing container and the cover unit are sealed via the seal member when the boat is carried into the processing container.

However, in the substrate processing apparatus, after the substrate is processed, the cover unit descends and the boat is carried out of the processing container by the lifting mechanism.

As a method of carrying the boat out of the processing container, there is known a method of performing a control such that the descending speed of the boat before the seal member is separated from the lower end of the processing container slower than the descending speed of the boat after the seal member is separated from the lower end of the processing container (see, e.g., Japanese Patent Laid-Open Publication No. 2005-056905). According to this method, the vibration of the cover unit, which is generated in the initial stage of lowering and carrying the boat out of the processing container, is suppressed.

SUMMARY

A substrate processing apparatus according to one aspect of the present disclosure includes: a substrate holding unit configured to hold a substrate, a processing container configured to accommodate the substrate holding unit; a cover unit configured to load the substrate holding unit thereon and open or close an opening provided in one end of the processing container; a seal member configured to seal a gap between the end of the processing container and the cover unit; a driving mechanism configured to move the cover unit; and a controller configured to control an operation of the driving mechanism. The controller controls the operation of the driving mechanism such that the cover unit performs an intermittent operation of alternately repeating moving and stopping when opening the opening in the processing container.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 1A and 1B are views schematically illustrating a configuration of an exemplary substrate processing apparatus of an exemplary embodiment.

DETAILED DESCRIPTION

Figure 2A:
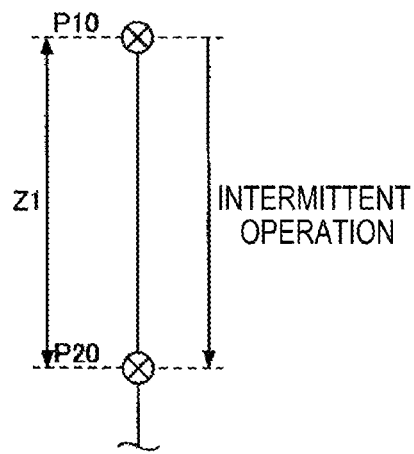
FIGS. 2A and 2B are views for explaining an operation of the substrate processing apparatus of a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above method, when adhesion between the lower end of the processing container and the seal member is increased compared to that before a processing is performed on the substrate due to, for example, variation in temperature of the processing container while the processing is performed on the substrate, the seal member may be in the state of sticking to the lower end of the processing container. When the seal member is in the state of sticking to the lower end of the processing container, the seal member may come off from the cover unit when the boat descends and is carried out of the processing container.

Accordingly, in one aspect, the present disclosure is to provide a substrate processing apparatus, which can suppress a seal member from coming off when a boat is carried out of a processing container.

A substrate processing apparatus according to one aspect of the present disclosure includes: a substrate holding unit configured to hold a substrate; a processing container configured to accommodate the substrate holding unit; a cover unit configured to load the substrate holding unit thereon and open or close an opening provided in one end of the processing container; a seal member configured to seal a gap between the end of the processing container and the cover unit; a driving mechanism configured to move the cover unit; and a controller configured to control an operation of the driving mechanism. The controller controls the operation of the driving mechanism such that the cover unit performs an intermittent operation of alternately repeating moving and stopping when opening the opening in the processing container.

In the above-described substrate processing apparatus, the seal member is attached to the cover unit.

In the above-described substrate processing apparatus, the controller controls an operation of the driving mechanism so that the cover unit performs a continuous operation of continuously moving after the seal member is separated from the end of the processing container.

In the above-described substrate processing apparatus, the controller controls the operation of the driving mechanism such that a moving speed of the continuous operation is faster than a moving speed of the intermittent operation.

In the above-described substrate processing apparatus, the controller controls the operation of the driving mechanism such that the cover unit performs a continuous operation of continuously moving before the cover unit performs the intermittent operation.

In the above-described substrate processing apparatus, in the intermittent operation, a time for the stopping is longer than a time for the moving.

In the above-described substrate processing apparatus, the seal member is an O-ring.

In accordance with one aspect of the present disclosure, disclosed is a substrate processing method including: performing a predetermined processing on a substrate held by a substrate holding unit accommodated in a processing container; opening an opening provided in one end of the processing container sealed by a cover unit via a seal member by moving the cover unit; and carrying the substrate holding unit out of the opening. The cover unit performs an intermittent operation of alternately repeating moving and stopping when opening the opening in the processing container.

In the above-described substrate processing method, the seal member is attached to the cover unit.

In the above-described substrate processing method, the cover unit performs a continuous operation of continuously moving after the seal member is separated from the end of the processing container.

In the above-described substrate processing method, a moving speed in the continuous operation is faster than a moving speed in the intermittent operation.

In the above-described substrate processing method, the cover unit performs a continuous operation of continuously moving before the cover unit performs the intermittent operation.

In the above-described substrate processing method, in the intermittent operation, a time for the stopping is longer than a time for the moving.

In the above-described substrate processing method, the predetermined processing includes a processing of heating the substrate.

According to a substrate processing apparatus of the disclosure, a seal member can be suppressed from coming off when a boat is carried out of the processing container.

Hereinafter, exemplary embodiments to implement the present disclosure will be described with reference to the accompanying drawings. In addition, in the present specification and the drawings, substantially the same elements are designated by the same reference numerals and redundant descriptions will be omitted.

(Substrate Processing Apparatus)

An exemplary substrate processing apparatus of the present exemplary embodiment will be described with reference to FIGS. 1A and 1B. FIGS. 1A and 1B are views schematically illustrating a configuration of an exemplary substrate processing apparatus of an exemplary embodiment. FIG. 1A illustrates a state where a wafer boat is carried into a processing container, and FIG. 1B illustrates a state where the wafer boat is carried out of the processing container.

As illustrated in FIGS. 1A and 1B, the substrate processing apparatus includes a substantially cylindrical processing container 4, the longitudinal direction of which is the vertical direction. The processing container 4 includes a processing vessel 6 having a ceiling. The processing vessel 6 is formed of a heat-resistant material, such as, for example, quartz. The processing vessel 6 is held at the lower end thereof by a manifold 10, which is formed of, for example, stainless steel. The manifold 10 is fixed on a base plate (not illustrated). In addition, although the manifold 10 is formed of a separate member from the processing vessel 6, it is assumed that the manifold 10 forms a portion of the processing container 4 because the manifold 10 is structurally integrally formed with the processing vessel 6 and defines a substantially cylindrical inner space with the processing vessel 6. That is, the processing container 4 includes the processing vessel 6 formed of a heat-resistant material, such as, for example, quartz, and the manifold 10 formed of, for example, stainless steel, and the manifold 10 is provided in the lower portion of the side surface of the processing container 4 so as to hold the processing vessel 6 from the lower side.

A disc-shaped cover unit 14 formed of, for example, stainless steel is attached to an opening 10a provided in the lower end (one end) of the manifold 10. The cover unit 14 opens or closes the opening 10a provided in the lower end of the manifold 10 (the processing container 4). An elastic seal member 16 such as, for example, an O-ring is attached to the cover unit 14, and the cover unit 14 may hermetically seal the opening 10a in the lower end of the manifold 10 via the seal member 16.

For example, as illustrated in FIG. 1A, the opening 10a is sealed by raising (upwardly moving) the cover unit 14 by a lifting mechanism 30 to be described below. At this time, the seal member 16 provided between the lower end of the manifold 10 and the cover unit 14 is pressed and contracted by the rising force of the cover unit 14 to be in close contact with the lower end of the manifold 10 and hermetically seal the opening 10a in the lower end of the manifold 10. In addition, for example, as illustrated in FIG. 1B, the opening 10a is opened by lowering (downwardly moving) the cover unit 14 by the lifting mechanism 30 to be described below.

On the cover unit 14, a table 24 formed of, for example, stainless steel is fixed. On the table 24, a heat reserving vessel 26 formed of, for example, quartz is installed. In addition, on the heat reserving vessel 26, a wafer boat 28 formed of, for example, quartz, is loaded.

The wafer boat 28 is an example of a substrate holding unit that holds a wafer in the processing container 4. In the wafer boat 28, a plurality of (e.g. 50 to 175) substrates (e.g., wafers) are accommodated at a predetermined interval (e.g., a pitch of about 10 mm). In addition, in FIGS. 1A and 1B, illustration of wafers is omitted.

The wafer boat 28, the heat reserving vessel 26, the table 24, and the cover unit 14 are integrally loaded into (carried into) and unloaded from (carried out of) the processing container 4 by the lifting mechanism 30, which functions as, for example, a boat lifter. The lifting mechanism 30 is an example of a driving mechanism that moves the cover unit 14.

When carrying the wafer boat 28 accommodated in the processing container 4 out of the processing container 4, the wafer boat 28, the heat reserving vessel 26, the table 24, and the cover unit 14 are lowered by the lifting mechanism 30. Thus, as illustrated in FIG. 1B, the opening 10a in the lower end of the manifold 10 is opened, and the wafer boat 28 is carried out of the opening 10a. At this time, in the present exemplary embodiment, the wafer boat 28 is carried out of the processing container 4 by intermittently lowering the cover unit 14 by the lifting mechanism 30. Thus, the seal member 16 attached to the cover unit 14 can be suppressed from coming off. In addition, the details of an operation for carrying out the wafer boat 28 will be described below.

In addition, although illustration is omitted, the substrate processing apparatus may be provided with, for example, a gas supply unit that supplies a processing gas or a purge gas into the processing container 4, an exhaust system that is capable of performing exhaust while adjusting the pressure of the atmosphere within the processing container 4, and a heater device that surrounds the processing container 4 to heat the wafers.

The control of respective components of the substrate processing apparatus (e.g., the lifting mechanism 30) is performed by a controller 90, such as, for example, a computer.

The controller 90 is connected to a storage unit 91 that stores a control program for realizing various processings to be executed in the substrate processing apparatus via the control of the controller 90, or various programs (or recipes) for causing respective components of the substrate processing apparatus to execute processings based on processing conditions. The programs include programs that cause the substrate processing apparatus to execute a substrate processing method to be described below. In addition, various programs may be stored in a storage medium to be stored in the storage unit 91. The storage medium may be a hard disc or a semiconductor memory, and may be a portable medium, such as, for example, a CD-ROM, a DVD, or a flash memory. In addition, recipes may be appropriately transmitted from other devices to the storage unit 91 via, for example, a dedicated line.

(Operation of Substrate Processing Apparatus)

Next, an operation of the substrate processing apparatus, which may suppress the seal member 16 attached to the cover unit 14 from coming off when the wafer boat 28 is carried out of the processing container 4, will be described based on first to third exemplary embodiments.

In the first to third exemplary embodiments, when opening the opening 10a in the processing container 4, the controller 90 controls the operation of the lifting mechanism 30 such that the cover unit 14 performs an intermittent operation of alternately repeating descending and stopping. Thus, because the seal member 16 is gradually peeled off from the manifold 10 when the wafer boat 28 is carried out of the processing container 4, the seal member 16 attached to the cover unit 14 can be suppressed from coming off.

First Exemplary Embodiment

An operation of the substrate processing apparatus of the first exemplary embodiment will be described. In the first exemplary embodiment, the controller 90 controls the operation of the lifting mechanism 30 such that the cover unit 14 performs an intermittent operation when opening the opening 10a in the lower end of the manifold 10. Hereinafter, descriptions will be made based on FIGS. 2A and 2B.

Figure 2B:
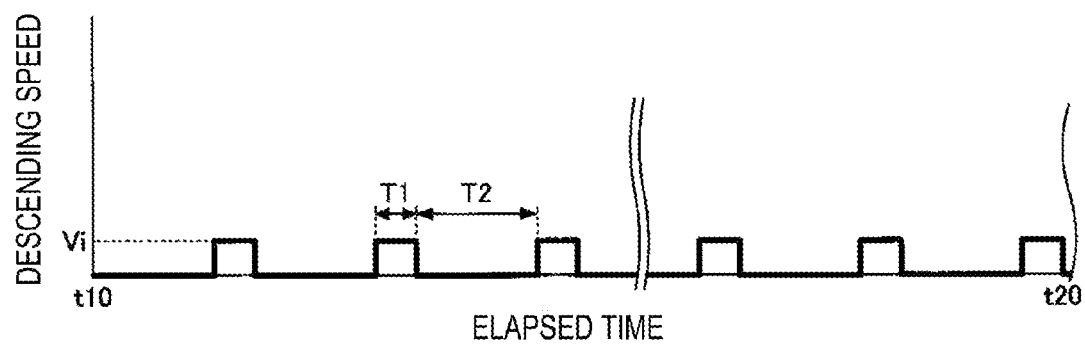

FIGS. 2A and 2B are views for explaining an operation of the substrate processing apparatus of the first exemplary embodiment. FIG. 2A is a view illustrating a relationship between the position and the operation of the cover unit. In FIG. 2A, the position P10 represents a position at which the cover unit 14 comes into close contact with the lower end of the manifold 10 via the seal member 16, and the position P20 represents a position that is lower than the lower end of the manifold 10 by a first distance Z1. FIG. 2B is a view illustrating a relationship between an elapsed time when the cover unit descends from the position P10 to the position P20 and the descending speed of the cover unit. In addition, in FIG. 2B, the time t10 is the time when the cover unit 14 is located at the position P10, and the time t20 is the time when the cover unit 14 is located at the position P20.

As illustrated in FIGS. 2A and 2B, the controller 90 controls the operation of the lifting mechanism 30 such that the cover unit 14 performs an intermittent operation of alternately repeating descending and stopping until the cover unit 14 reaches the position P20 starting from the position P10. The descending speed Vi when the cover unit 14 descends in the intermittent operation may be, for example, 10 mm/min. The position P20 may be a position that is lower than the position at which the seal member 16 attached to the cover unit 14 is separated from the lower end of the manifold 10, and may be determined depending on, for example, the material and line diameter (the thickness of the cross section) of the seal member 16. The first distance Z1, which is the distance between the position P10 and the position P20, may be, for example, 10 mm.

After the cover unit 14 reaches the position P20, the controller 90 controls the operation of the lifting mechanism 30 such that the cover unit 14 descends at an arbitrarily set descending speed.

In addition, as illustrated in FIG. 2B, in the intermittent operation, the time T2 for the stopping may be longer than the time T1 for the descending. When the time T2 for the stopping is longer than the time T1 for the descending in the intermittent operation, the time for which the cover unit 14 is stopped may be secured, and the seal member 16 may be peeled off from the manifold 10 while the cover unit 14 is stopped. Thus, the seal member 16 may be more slowly peeled off from the manifold 10 compared to the case where the seal member 16 is peeled off from the manifold 10 while the cover unit 14 descends. Therefore, vibration generated when the seal member 16 is peeled off from the manifold 10 can be especially suppressed.

In the operation of the substrate processing apparatus of the first exemplary embodiment, when opening the opening 10a in the processing container 4, the controller 90 controls the operation of the lifting mechanism 30 such that the cover unit 14 performs an intermittent operation of alternately repeating descending and stopping. Thus, because the seal member 16 is gradually peeled off from the manifold 10 when the wafer boat 28 is carried out of the processing container 4, the seal member 16 attached to the cover unit 14 can be suppressed from coming off. In addition, vibration generated when the seal member 16 is peeled off from the manifold 10 can be suppressed. In addition, because the application of excessive load to the lifting mechanism 30 can be suppressed, the lifespan of the lifting mechanism 30 can be extended.

Second Exemplary Embodiment

An operation of the substrate processing apparatus according to the second exemplary embodiment will be described. In the second exemplary embodiment, the controller 90 controls the operation of the lifting mechanism 30 such that the cover unit 14 performs a continuous operation after the seal member 16 is separated from the lower end of the manifold 10. Hereinafter, descriptions will be made based on FIGS. 3A and 3B.

Figure 3A:
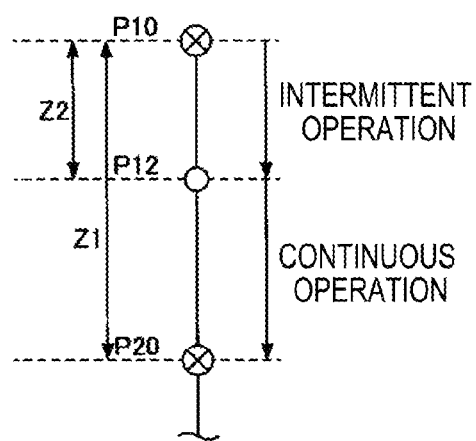
FIGS. 3A and 3B are views for explaining an operation of the substrate processing apparatus of a second exemplary embodiment.
Figure 3B:
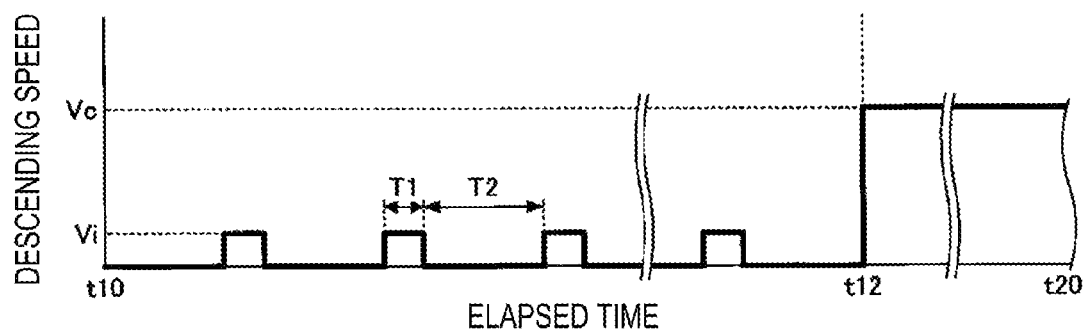

FIGS. 3A and 3B are views for explaining an operation of the substrate processing apparatus of the second exemplary embodiment. FIG. 3A is a view illustrating a relationship between the position and the operation of the cover unit. In FIG. 3A, the position P10 represents a position at which the cover unit 14 comes into close contact with the lower end of the manifold 10 via the seal member 16. In addition, the position P12 represents a position that is lower than the position P10 by a second distance Z2. In addition, the position P20 represents a position that is lower than the lower end of the manifold 10 by the first distance Z1. FIG. 3B is a view illustrating a relationship between an elapsed time when the cover unit descends from the position P10 to the position P20 and the descending speed of the cover unit. In addition, in FIG. 3B, times t10, t12, and t20 are the times when the cover unit 14 is located at the positions P10, P12, and P20, respectively.

As illustrated in FIGS. 3A and 3B, the controller 90 controls the operation of the lifting mechanism 30 such that the cover unit 14 performs an intermittent operation of alternately repeating descending and stopping until the cover unit 14 reaches to the position P20 starting from the position P10. The position P12 may be a position that is lower than the position at which the seal member 16 attached to the cover unit 14 is separated from the lower end of the manifold 10 and a position that is higher than the position P20, and may be determined depending on, for example, the material and line diameter of the seal member 16. The second distance Z2, which is the distance between the position P10 and the position P12, may be, for example, 4.5 mm.

After the cover unit 14 reaches the position P12, the controller 90 controls the lifting mechanism 30 such that the cover unit 14 performs a continuous operation of continuously descending until the cover unit 14 reaches the position P20. The position P20 may be the same position as in the first exemplary embodiment.

After the cover unit 14 reaches the position P20, the controller 90 controls the operation of the lifting mechanism 30 such that the cover unit 14 descends at an arbitrarily set descending speed.

In addition, as illustrated in FIG. 3B, in the viewpoint of being capable of especially improving the throughput, the controller 90 may control the operation of the lifting mechanism 30 such that the descending speed Vc in the continuous operation is faster than the descending speed Vi in the intermittent operation. The descending speed Vi in the intermittent operation may be, for example, 10 mm/min, and the descending speed Vc in the continuous operation may be, for example, 100 mm/min.

In the operation of the substrate processing apparatus of the second exemplary embodiment, when opening the opening 10a in the processing container 4, the controller 90 controls the operation of the lifting mechanism 30 such that the cover unit 14 performs an intermittent operation of alternately repeating descending and stopping, as in the first exemplary embodiment. Thus, because the seal member 16 is gradually peeled off from the manifold 10 when the wafer boat 28 is carried out of the processing container 4, the seal member 16 attached to the cover unit 14 can be suppressed from coming off. In addition, vibration generated during the carry-out of the wafer boat 28 can be suppressed. In addition, because the application of excessive load to the lifting mechanism 30 can be suppressed, the lifespan of the lifting mechanism 30 can be extended.

In particular, in the operation of the substrate processing apparatus of the second exemplary embodiment, after the seal member 16 is separated from the lower end of the manifold 10, the intermittent operation is switched to the continuous operation. Therefore, the time required until the cover unit 14 the position P20 starting from the position P10 may be reduced compared to the operation of the substrate processing apparatus of the first exemplary embodiment. As a result, the throughput is improved compared to the operation of the substrate processing apparatus of the first exemplary embodiment.

Third Exemplary Embodiment

An operation of the substrate processing apparatus of the third exemplary embodiment will be described. In the third exemplary embodiment, the controller 90 controls an operation of the lifting mechanism 30 so that the cover unit 14 performs a continuous operation before the cover unit 14 performs an intermittent operation. Hereinafter, a description will be based on FIGS. 4A and 4B.

Figure 4A:
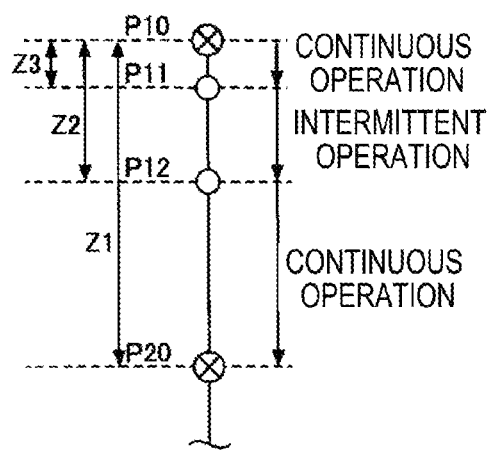
FIGS. 4A and 4B are views for explaining an operation of the substrate processing apparatus of a third exemplary embodiment.
Figure 4B:
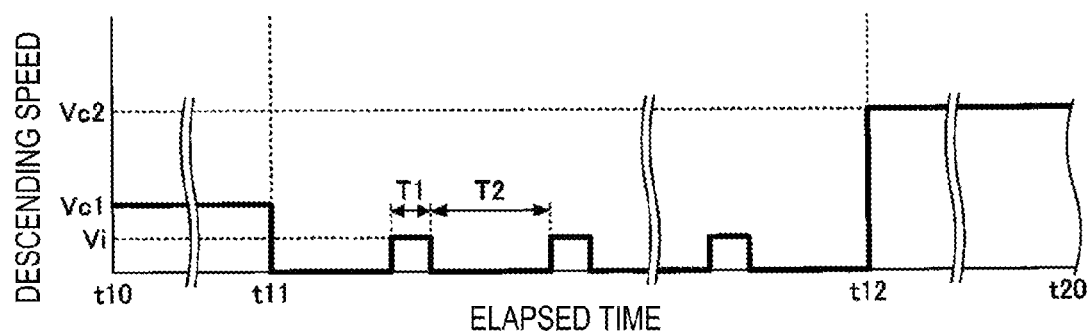

FIGS. 4A and 4B are views for explaining an operation of the substrate processing apparatus of the third exemplary embodiment. FIG. 4A is a view illustrating a relationship between the position of the cover unit and the operation. In FIG. 4A, the position P10 represents the position at which the cover unit 14 comes into close contact with the lower end of the manifold 10 with the seal member 16 being interposed therebetween. In addition, the position P11 represents the position that is lower than the position P10 by a third distance Z3, and the position P12 represents the position that is lower than the position P10 by the second distance Z2. In addition, the position P20 represents the position that is lower than the lower end of the manifold 10 by the first distance Z1. FIG. 4B is a view illustrating a relationship between the lapsed time when the cover unit descends from the position P10 to the position P20 and the descending speed of the cover unit. In addition, in FIG. 4B, the points in time t10, t11, t12 and t20 are respectively the points in time when the cover unit 14 is located at the positions P10, P11, P12 and P20.

As illustrated in FIGS. 4A and 4B, the controller 90 controls the lifting mechanism 30 so that the cover unit 14 performs a continuous operation of continuously lowering for a duration until the cover unit 14 reaches from the position P10 to the position P11. The position P11 may be the position at which the seal member 16, which has been pressed and contracted at the position P10, is elastically returned to the original state thereof, or the position that is higher than the position at which the seal member 16 is elastically returned to the original state thereof, and may be determined depending on, for example, the material and the line diameter of the seal member 16. The third distance Z3, which is the distance between the position P10 and the position P11, may be 1.5 mm when the line diameter of the seal member 16 is reduced at, for example, the position P10 by 1.5 mm compared to the state where no external force is applied thereto.

After the cover unit 14 reaches the position P11, the controller 90 controls an operation of the lifting mechanism 30 so that the cover unit 14 performs an intermittent operation of alternately repeating descending and stopping for a duration until the cover unit 14 reaches the position P12. The position P12 may be the same position as in the second exemplary embodiment.

After the cover unit 14 reaches the position P12, the controller 90 controls the lifting mechanism 30 such that that the cover unit 14 performs a continuous operation of continuously descending until the cover unit 14 reaches the position P20. The position P20 may be the same position as that in the first exemplary embodiment.

After the cover unit 14 reaches the position P20, the controller 90 controls the operation of the lifting mechanism 30 such that the cover unit 14 descends at an arbitrarily set descending speed.

In addition, as illustrated in FIG. 4B, in the viewpoint of being capable of especially improving the throughput, the controller 90 may control the operation of the lifting mechanism 30 such that the descending speeds Vc1 and Vc2 in the continuous operation are faster than the descending speed Vi in the intermittent operation. The descending speed Vc1 in the continuous operation may be, for example, 40 mm/min, the descending speed Vc2 in the continuous operation may be, for example, 100 mm/min, and the descending speed Vi in the intermittent operation may be, for example, 10 mm/min.

In the operation of the substrate processing apparatus of the third exemplary embodiment, when opening the opening 10a in the processing container 4, the controller 90 controls the operation of the lifting mechanism 30 such that the cover unit 14 performs an intermittent operation of alternately repeating descending and stopping, as in the first exemplary embodiment. Thus, because the seal member 16 is gradually peeled off from the manifold 10 when the wafer boat 28 is carried out of the processing container 4, the seal member 16 attached to the cover unit 14 can be suppressed from coming off. In addition, vibration generated during the carry-out of the wafer boat 28 can be suppressed. In addition, the application of excessive load to the lifting mechanism 30 can be suppressed, the lifespan of the lifting mechanism 30 can be extended.

In addition, in the operation of the substrate processing apparatus of the third exemplary embodiment, the cover unit 14 performs a continuous operation after the seal member 16 is separated from the lower end of the manifold 10, as in the second exemplary embodiment. Therefore, the time required until the cover unit 14 reaches the position P20 starting from the position P10 may be reduced compared to the operation of the substrate processing apparatus of the first exemplary embodiment. As a result, the throughput is improved compared to the operation of the substrate processing apparatus of the first exemplary embodiment.

In particular, in the operation of the substrate processing apparatus of the third exemplary embodiment, because the cover unit 14 performs a continuous operation before the cover unit 14 performs an intermittent operation, the time required until the cover unit 14 reaches the position P20 from the position P10 can be reduced compared to the operation of the substrate processing apparatus of the second exemplary embodiment. As a result, the throughput is improved compared to the operation of the substrate processing apparatus of the second exemplary embodiment.

(Substrate Processing Method)

Next, a substrate processing method including the operation of the substrate processing apparatus of the present exemplary embodiment will be described.

First, the wafer boat 28 loaded with a plurality of wafers is raised from the lower side and carried into the processing container 4, which has been previously adjusted to a predetermined temperature, and the cover unit 14 closes the opening 10a in the lower end of the manifold 10, thereby sealing the inside of the processing container 4. Subsequently, the inside of the processing container 4 is evacuated and is maintained at a predetermined process pressure, and a power is supplied to the heater device such that the temperature of the wafers is increased to maintain a process temperature.

Subsequently, a predetermined processing, such as, for example, a heat treatment, is performed on the wafers held in the wafer boat 28 by supplying a processing gas or a purge gas into the processing container 4 from the gas supply unit.

After the predetermined processing is performed on the wafers, the cover unit 14, which has sealed the opening 10a in the processing container 4 via the seal member 16, descends to open the opening 10a by the lifting mechanism 30, and the wafer boat 28 is carried out of the opening 10a. At this time, the above-described operation of the substrate processing apparatus is performed. That is, when opening the opening 10a in the processing container 4, the cover unit 14 performs an intermittent operation of alternately repeating descending and stopping.

As described above, a predetermined processing may be performed on the wafers.

In the substrate processing method of the present exemplary embodiment, when carrying the wafers out of the processing container 4, the cover unit 14 performs an intermittent operation of alternately repeating descending and stopping. Thus, even when adhesion between the lower end of the processing container 4 and the seal member 16 is increased by, for example, variation in temperature of the processing container 4 while the predetermined processing is performed on the wafers, the seal member 16 attached to the cover unit 14 can be suppressed from coming off.

Although the substrate processing apparatus and the substrate processing method have been described above based on the exemplary embodiments, the present disclosure is not limited to the exemplary embodiments, and various alterations and modifications can be made within the scope of the present disclosure.

The form in which the seal member 16 is attached to the cover unit 14 has been described in the exemplary embodiments. However, the present disclosure is not limited thereto, and the seal member 16 may be attached to the lower end of the manifold 10.

In addition, a vertical substrate processing apparatus, which lowers the cover unit 14 by the lifting mechanism 30 when carrying the wafers accommodated in the processing container 4 out of the processing container 4, has been described in the exemplary embodiments, but the present disclosure is not limited thereto. For example, a horizontal substrate processing apparatus, which horizontally moves the cover unit 14 by a driving mechanism when carrying the wafers accommodated in the processing container 4 out of the processing container 4, may be provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate holding unit configured to hold a substrate;
   a processing container configured to accommodate the substrate holding unit;
   a cover unit configured to load the substrate holding unit thereon and open or close an opening provided in one end of the processing container;
   a seal member configured to seal a gap between the end of the processing container and the cover unit;
   a driving mechanism configured to move the cover unit; and
   a controller configured to control an operation of the driving mechanism,
   wherein the controller is configured to control the operation of the driving mechanism such that the cover unit repeats, at least twice, an intermittent operation of stopping for a first period of time after moving at a first constant velocity for a second period of time when opening the opening in the processing container and descends by a distance during the intermittent operation.

2. The substrate processing apparatus of claim 1, wherein the seal member is attached to the cover unit.

3. The substrate processing apparatus of claim 2, wherein the controller is configured to control the operation of the driving mechanism such that the cover unit performs a continuous operation of continuously moving after the seal member is separated from the end of the processing container.

4. The substrate processing apparatus of claim 3, wherein the controller is configured to control the operation of the driving mechanism such that a moving speed in the continuous operation is faster than a moving speed in the intermittent operation.

5. The substrate processing apparatus of claim 1, wherein the controller is configured to control the operation of the driving mechanism such that the cover unit performs a continuous operation of continuously moving before the cover unit performs the intermittent operation.

6. The substrate processing apparatus of claim 1, wherein, in the intermittent operation, the first period of time for the stopping is longer than the second period of time for the moving.

7. The substrate processing apparatus of claim 1, wherein the seal member is an O-ring.

8. A substrate processing method comprising:
performing a predetermined processing on a substrate held by a substrate holding unit accommodated in a processing container;
opening an opening provided in one end of the processing container and sealed by a cover unit via a seal member by moving the cover unit; and
carrying the substrate holding unit out of the opening,
wherein the controller is configured to control the operation of the driving mechanism such that the cover unit repeats, at least twice, an intermittent operation of stopping for a first period of time after moving at a first constant velocity for a second period of time when opening the opening in the processing container and descends by a distance during the intermittent operation.

9. The substrate processing method of claim 8, wherein the seal member is attached to the cover unit.

10. The substrate processing method of claim 9, wherein the cover unit performs a continuous operation of continuously moving after the seal member is separated from the end of the processing container.

11. The substrate processing method of claim 10, wherein a moving speed in the continuous operation is faster than a moving speed in the intermittent operation.

12. The substrate processing method of claim 8, wherein the cover unit performs a continuous operation of continuously moving before the cover unit performs the intermittent operation.

13. The substrate processing method of claim 8, wherein, in the intermittent operation, the first period of time for the stopping is longer than the second period of time for the moving.

14. The substrate processing method of claim 8, wherein the predetermined processing includes a process of heating the substrate.

* * * * *